United States Patent [19]
Kennel

[11] Patent Number: 6,156,256
[45] Date of Patent: Dec. 5, 2000

[54] PLASMA CATALYSIS OF CARBON NANOFIBERS

[75] Inventor: Elliot Byron Kennel, Beavercreek, Ohio

[73] Assignee: Applied Sciences, Inc., Cedarville, Ohio

[21] Appl. No.: 09/078,187

[22] Filed: May 13, 1998

[51] Int. Cl.⁷ .......................... B29C 35/08; B29C 67/02
[52] U.S. Cl. ................ 264/461; 264/469; 264/489; 264/128
[58] Field of Search ........................ 264/128, 461, 264/483, 496, 469, 460, 485, 489, 494, 29.3, 29.6; 118/723 MW, 723 ME; 423/447.1, 447.2, 447.3, 447.7

[56] References Cited

U.S. PATENT DOCUMENTS

| | | |
|---|---|---|
| 2,375,796 | 5/1945 | Krejci . |
| 2,796,331 | 6/1957 | Kauffman et al. . |
| 4,328,151 | 5/1982 | Robinson . |
| 4,474,906 | 10/1984 | Nakama et al. . |
| 4,490,201 | 12/1984 | Leeds . |
| 4,684,336 | 8/1987 | Brotz ........................ 264/469 |
| 4,855,091 | 8/1989 | Geus et al. . |
| 4,855,122 | 8/1989 | Kitamura et al. . |
| 4,859,493 | 8/1989 | Lemelson . |
| 4,915,925 | 4/1990 | Chung . |
| 4,940,015 | 7/1990 | Kobashi et al. . |
| 4,999,244 | 3/1991 | Morimoto . |
| 5,024,818 | 6/1991 | Tibbetts et al. . |
| 5,171,489 | 12/1992 | Hirao et al. . |
| 5,374,415 | 12/1994 | Alig et al. . |
| 5,389,400 | 2/1995 | Ting et al. . |
| 5,413,773 | 5/1995 | Tibbetts et al. . |
| 5,433,906 | 7/1995 | Dasch et al. . |
| 5,594,060 | 1/1997 | Alig et al. . |

FOREIGN PATENT DOCUMENTS

| | | |
|---|---|---|
| 0 646 544 | 4/1995 | European Pat. Off. . |
| 41 03 981 | 8/1992 | Germany . |
| 42 08 719 | 9/1993 | Germany . |
| 197 40 389 | 3/1999 | Germany . |

OTHER PUBLICATIONS

A.R. Badzian et al., "Crystallization of Diamond Crystals and Films by Microwave Assisted CVD (Part II)" *Mat. Res. Bull.*, vol. 23, pp. 531–548, 1988.

Chang et al., "Diamond Crystal Growth by Plasma Chemical Vapor Deposition" *J. Appl. Phys.* 63(5), Mar. 1, 1988.

A.R. Badzian et al., "Diamond Thin Films Prepared by Plasma Chemical Vapor Deposition Processes" Mat. Research Soc. Meeting, Jun. 1987, vol. 15, pp. 63–77, Les Addition de Physique, Paris.

*Primary Examiner*—Angela Ortiz
*Attorney, Agent, or Firm*—Killworth, Gottman, Hagan & Schaeff, L.L.P.

[57] ABSTRACT

A process for forming carbon nanofibers by means of pyrolyzation with plasma in a reactor is disclosed. The process includes the steps of: providing, in a reactor, a first catalyst in the form of solid catalytic particles; applying a vacuum to the reactor to create a reduced pressure in the reactor; feeding a first mixture of gases including a carbon-based gas into the reactor; forming, from the carbon-based gas, a plasma containing carbon free-radical species; and forming, in the presence of the catalytic particles, carbon nanofibers.

24 Claims, 2 Drawing Sheets

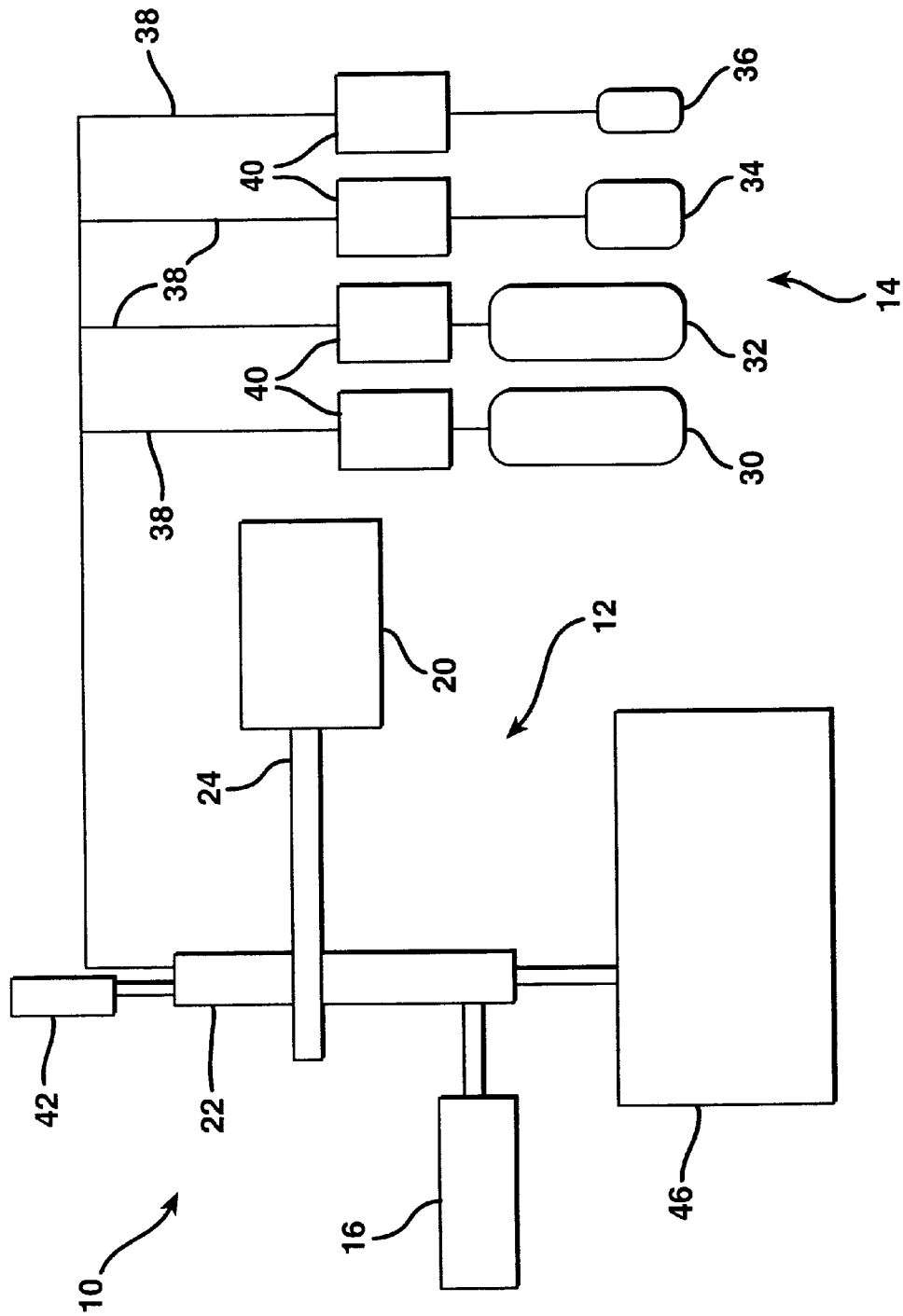

PLASMA CATALYSIS OF CARBON NANOFIBERS

BACKGROUND OF THE INVENTION

The present invention relates to a method for forming carbon nanofibers, which are also known as nanotubes, by means of a generated plasma and chemically assisted catalysis.

Carbon fibers hold great promise as a high-performance material for use in composites due to their high strength and high modulus. They are commonly made by elevating a precursor material such as polyacrylonitrile (PAN) or pitch in an inert atmosphere to a temperature around 1000° C. on continuous wind-up devices. The fibers formed by this process are generally continuous filaments and approximately 8 $\mu$m in diameter.

Recently, carbon nanofibers have been produced directly from hydrocarbons in a gas phase reaction upon contact with a catalytic metal particle when heated by thermal energy to around 1000° C. in a non-oxidizing gas stream. Carbon nanofibers differ physically from commercial carbon fibers in that they are thinner and are not continuous. Typically, they have a length around 0.01 mm to 0.1 mm and have a diameter generally of 10 nm to 100 nm. Carbon nanofibers also differ functionally from commercial carbon fibers in that they have a higher thermal conductivity, have high electrical conductivity, and are less subject to etching. Accordingly, carbon nanofibers offer great promise in a number of applications.

Carbon nanotubes are structures which consist of a sheet of carbon atoms in graphene forms wrapped into a cylinder. A single walled nanotube has only a single atomic layer. Multiwalled nanotubes have additional layers of carbon deposited pyrolytically. Multiwalled nanotubes may thus contain 100 to 1000 atomic layers. Multiwalled nanotubes have excellent strength, small diameter (typically less than 200 nm) and near-metallic electrical conductivity, making them useful as an additive to enhance structural properties of composites such as carbon-carbon, carbon-epoxy, carbon-metal, carbon-plastic, carbon-polymer and carbon-concrete.

Carbon nanotubes have been produced by arc-evaporation chemical reactions and by pyrolysis reactions using lasers to initiate pyrolysis. However, these methods are not effective for producing significant quantities of nanofibers. Thus, a need exists in the art for a method which can reliably and effectively produce carbon nanofibers in significant quantities.

SUMMARY OF THE INVENTION

The present invention provides a method for making carbon nanofibers and nanotubes which is quick and efficient. By being quick and efficient, it has the potential to be less expensive than currently used methods.

In one aspect of the process present invention, carbon nanofibers are formed in a reactor. The process includes the steps of: providing, in a reactor, a first catalyst in the form of solid catalytic particles; applying a vacuum to the reactor to create a reduced pressure in the reactor; feeding a first mixture of gases including a carbon-based gas into the reactor; forming, from the carbon-based gas, a plasma containing carbon free-radical species; and forming, in the presence of the catalytic particles, the carbon free-radical species into carbon nanofibers. Desirably, the first mixture of gases also includes hydrogen gas which is provided to inhibit pyrolytic fattening of the carbon nanofibers and to inhibit the formation of soot during the reaction. It is also desirable that the process includes the additional step of feeding a growth catalyst gas into the reactor to cause the fibers to increase diametrically in size.

The carbon nanofibers of the present invention can be further processed to form a carbon-carbon matrix material. To form a carbon-carbon matrix material, the process includes the following additional steps: increasing the concentration of the carbon-based gas in the first mixture of gases to form a concentration of the carbon-based gas in the first mixture of gases to form a second mixture of gases; pyrolyzing the second mixture of gases to deposit a bulk layer of carbon on the carbon nanofibers forming a carbon-carbon matrix material which contains carbon nanofibers throughout its thickness; and removing the matrix material from the reactor.

In another aspect of the process of the present invention, a gaseous catalyst can be used to facilitate formation of the carbon nanofibers. This aspect of the process includes the following steps: applying a vacuum to the reactor to create a reduced pressure in the reactor; feeding a mixture of gases including a carbon-based gas into the reactor; feeding a catalyst gas into the reactor; forming, from the carbon-based gas, a plasma containing carbon free-radical species; and forming, in the presence of the catalyst gas, the carbon free-radical species into carbon nanofibers. Desirably, the mixture of gases also includes hydrogen gas which is provided to inhibit pyrolytic fattening of the carbon nanofibers as they are being formed and to inhibit the formation of soot during the reaction. It is also desirable with the process that the process also includes the additional step of feeding a growth catalyst gas into the reactor to cause the fibers to increase diametrically in size.

The carbon nanofibers of the present invention can be further processed to form a carbon-carbon matrix material. To form a carbon-carbon matrix material, the process includes the following additional steps: increasing the concentration of the carbon-based gas in the first mixture of gases to form a second mixture of gases; pyrolyzing the second mixture of gases to deposit a bulk layer of carbon on the carbon nanofibers forming a carbon-carbon matrix material which contains carbon nanofibers throughout its thickness; and removing the matrix material from the reactor.

The present invention is also directed to a process for forming a carbon-epoxy matrix material. This process comprises the following steps:

providing, in a reactor, solid catalyst particles on a substrate; feeding a mixture of gases including a hydrogen gas and a carbon-based gas into the reactor; forming, from the carbon-based gas, a plasma containing carbon free-radical species; forming, in the presence of the catalytic particles, the carbon free-radical species into carbon nanofibers; removing the substrate bearing the carbon nanofibers from the reactor; forming a mold in which a portion of the mold is formed by the substrate; infiltrating the mold with an epoxy composition to form a carbon-epoxy matrix material containing carbon nanofibers throughout its thickness; and removing the matrix material from the mold.

Objects and advantages of the present invention will be apparent from the following detailed description, the accompanying drawings and the appended claims.

BRIEF DESCRIPTION OF THE DRAWINGS

FIG. 3 is a schematic representation of the equipment used to produce carbon nanostructures via microwave dissociation.

DETAILED DESCRIPTION OF THE INVENTION

Figure 1:
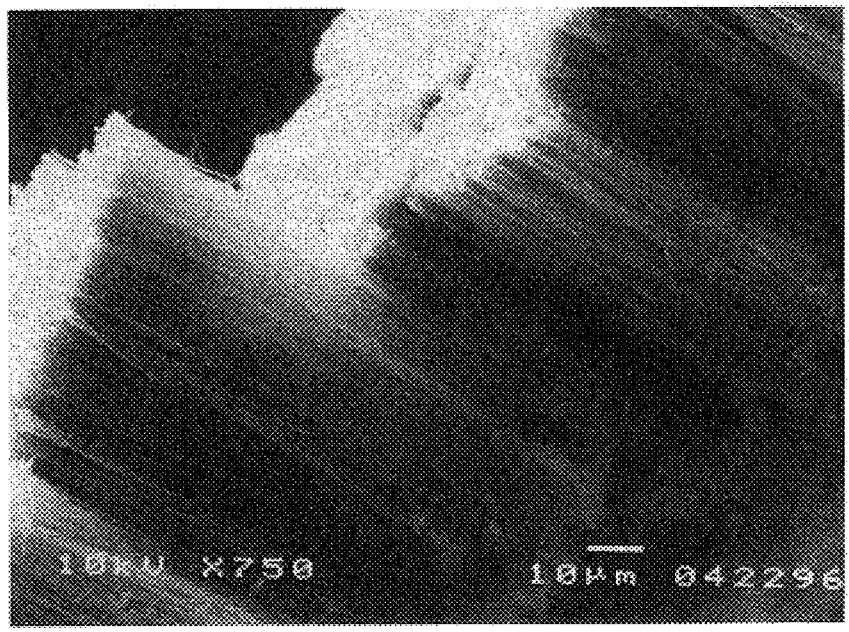
FIG. 1 is a photomicrograph of the carbon nanostructures formed by the process of this invention.
Figure 2:
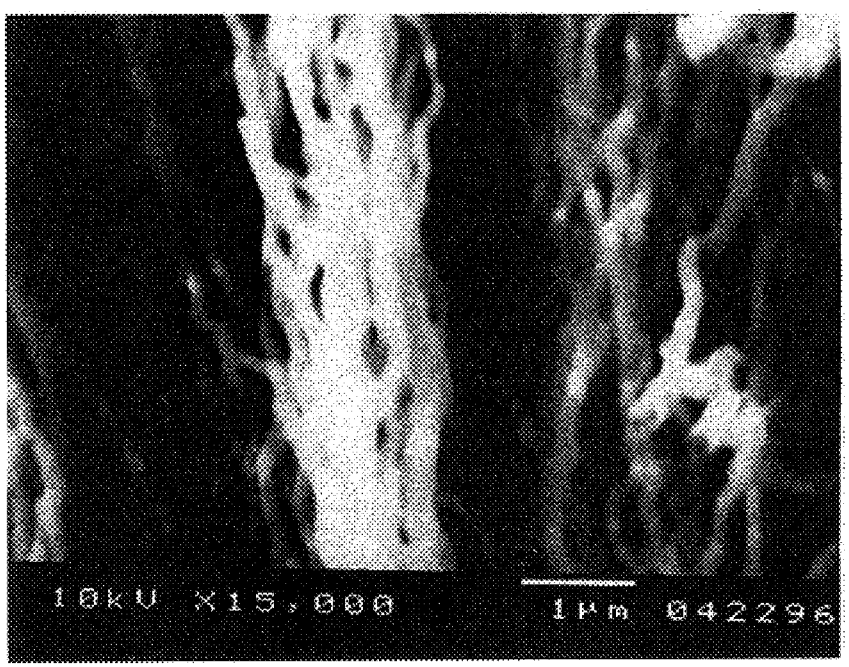
FIG. 2 is a photomicrograph showing the crosslinking of the carbon nanostructures formed by the process of this invention.

The method of this invention produces carbon nanostructures such as those shown in FIGS. 1 and 2. FIG. 1 is a photomicrograph at 750X magnification and FIG. 2 is a photomicrograph at 15,000X magnification. The fibers, shown in FIGS. 1 and 2, have a diameter of about 100 nm, which is about three orders of magnitude smaller than conventional pitch or PAN-based fibers. For that reason, these fibers are referred to as being "nanofibers." The fibers typically have a length of about 1–2 mm. Thus, they have an aspect ration (L/d) of about $1\times10^4$ and a surface area to volume ratio of about $1\times10^{14} m^{-1}$. Further, as can be seen in FIG. 2, the individual fibers tend to cross-link with each other which increases the capacity of the fibers to conduct heat and electricity. These fibers also have a high level of graphitization which further increases their high thermal conductivity and provides near-metallic electrical conductivity.

The carbon nanofibers are formed by a chemical catalysis of a plasma formed from a carbon-based gas. The plasma is formed by means of the plasma generator. Typically, the plasma generating source is a microwave generator, a hot filament, an RF generator or an electrical discharge. This differs from the prior art which uses thermal energy sources, such as lasers, or chemical sources to form carbon nanofibers.

To form the fibers, a mixture of gases, including the carbon-based gas, are provided in a reactor. Typically, these gases, which form the mixture, are fed into the reactor from tanks containing the respective gases. The formation of the fibers is carried out at a reduced pressure of from about 10 Torr to about 100 Torr and, desirably, from about 20 Torr to about 50 Torr. The carbon-based gas is formed into a plasma in the presence of a first catalyst in the reactor. The mixture of gases can be formed into a plasma by means of a plasma generating source such as a microwave generator, a hot filament, an RF generator or an electrical discharge. The first catalyst can be either in the form of solid catalytic particles or in a gaseous state. If a solid catalyst is used, it is placed on a substrate in the reactor. If a substrate is used, the substrate has a temperature from about 800° C. to about 1200° C. and, desirably, a temperature from 800° C. to about 1000° C. Desirably, the mixture of gases also includes hydrogen gas. The hydrogen gas is provided to inhibit pyrolytic fattening of the nanofibers and to inhibit the formation of soot during the pyrolysis reaction. Once the plasma has been formed from the carbon-based gas, carbon nanofibers are formed by the chemically catalyzed deposition of carbon from the carbon free-radical species generated in the plasma. A second catalyst in the form of a growth catalyst gas may also be used to promote diametric growth of the fibers.

In the plasma, carbon atoms are dissociated from the carbon-based gas and a plasma is formed which contains carbon and hydrocarbon free-radicals. Then the carbon is captured by the catalyst to form the carbon nanofibers. The entire process requires no more than about one hour of time from start to finish.

The carbon-based gas must be a gas which forms carbon and hydrocarbon free-radical species upon pyrolysis. Desirably, the carbon-based gas used to form the carbon fibers is at least one gas selected from the group consisting of carbon dioxide, methane, ethane, propane, ethene, natural gas and coal derivative gases. The carbon-based gas may also be a mixture of these gases. More desirably, the carbon-based gas is methane. Desirably, the gas mixture used to form the carbon fibers includes from about 40% to about 90% of hydrogen gas and from about 10% to about 60% of the carbon-based gas. More desirably, the gas mixture comprises about a 50—50 mixture of hydrogen gas and the carbon-based gas. Typically, the gas flow for the fiber formation reaction measures from about 20 sccm to about 1000 sccm and desirably is about 100 sccm.

In one aspect of the process of the present invention, to initiate formation of the nanofibers, the first catalyst is provided in the form of solid particles having a size from about 10 nm to about 1 micron. The first catalyst is selected from the group consisting of iron containing materials, nickel containing materials, cobalt containing materials and sulfur containing materials. Useful materials for the first catalyst include, but are not limited to, iron, nickel, cobalt, ferrocene, iron pentacarbonyl, alloys of iron, alloys of nickel, alloys of cobalt, sulfur, hydrogen sulfide, iron sulfide, and nickel nitrate. Desirably, the first catalyst is iron sulfide. It is believed that the particles of the first catalyst serve to nucleate the fibers and cause the beginning of fiber formation. Typically, from about 10 mg to about 100 mg of the first catalyst in the form of particles is used to form 10 mg of fibers.

In a more desired version of this aspect of the invention, a second, growth catalyst gas may also be used in combination with the hydrogen gas and the carbon-based gas to modify the surface properties of the fibers. The growth catalyst is applied to "fatten" the fibers, i.e., it is a second catalyst which promotes diametric growth of the fiber. Useful growth catalysts include hydrogen, ammonia and mixtures thereof. Desirably, the growth catalyst will be ammonia.

In another aspect of the process of the present invention, the first catalyst can be provided in a gaseous state rather than being provided as solid particles. If the first catalyst is used in a gaseous state, it may be supplied in combination with the hydrogen gas and the carbon-based gas simultaneously as a mixture of gases. In this reaction, the carbon nanofibers are produced on a steady state basis and are collected as they form. If the first catalyst is in the gaseous form, it will be selected from the group consisting of iron pentacarbonyl, hydrogen sulfide, and a ferrocene-xylene mixture.

A deposition apparatus 10 useful for forming the carbon nanofibers shown in FIGS. 1 and 2 is shown in FIG. 3. The apparatus 10 comprises a plasma reactor 12, a series of gas tanks 14, and a vacuum pump 16. Gas tanks 14 feed gas into reactor 12 and pump 16 is provided to create a reduced pressure in reactor 12. Reactor 12 is desirably a microwave reactor such as an ASTEX microwave reactor available from Applied Science and Technology of Woburn, Mass., U.S.A. Pump 16 can be a conventional mechanical vacuum pump. A useful vacuum pump is available from Varian Vacuum Products of Lexington, Mass., U.S.A. Pump 16 desirably includes an associated pressure measuring device, which is desirably a baratron device.

Reactor 12 includes a power supply 20, a feed tube 22 and a waveguide 24. Power supply 20 provides reactor 12 with a source of energy. Desirably, reactor 12 is a microwave reactor and power supply 20 is a microwave generator. Thus, the energy source used to form the plasma from the carbon-based gas is desirably microwave energy. Feed tube 22 is disposed in reactor 12 and extends generally axially therein. Desirably, feed tube 22 extends along more than ½ of the length of reactor 12 and more desirably extends along more than ¾ of the length of reactor 12. Waveguide 24 extends from power supply 20 to feed tube 22. Waveguide 24 directs energy from power supply 20 to feed tube 22. Reactor 12 and feed tube 22 are desirably constructed of a material which is resistant to heat and corrosion. Suitable materials include nickel, high temperature steel, quartz, ceramic, and refractory materials. Desirably, feed tube 22 is formed from quartz. An optional catch basin 46 may be positioned at one end of feed tube 22. Catch basin 46 is used to collect fibers formed when the first catalyst is a gas.

Gas tanks 14 include a hydrogen gas tank 30, a carbon-based gas tank 32, an optional tank 34 for containing the growth catalyst, and an optional tank 36 for containing a gaseous catalyst. Gas tanks 30, 32, 34 and 36 are connected to feed tube 22 by a series of gas lines 38. Control of the flow of gas from tanks 30, 32, 34 and 36 is provided by a series of mass flow controllers 40.

To monitor the temperature of the reaction which forms the carbon fibers, the apparatus 10 may also include an optical pyrometer 42. Pyrometer 42 is used instead of a thermocouple because thermocouples are susceptible to interaction with the field of plasma generated in reactor 12.

When the first catalyst is in the form of solid catalytic particles, a substrate (not shown) is used to support the first catalyst in reactor 12. The substrate is desirably formed from an inert dielectric material such as quartz, ceramic and refractory materials. Desirably, the substrate is ceramic. Metals, such as molybdenum, titanium and nickel may also be used.

The first catalyst, in the form of solid catalytic particles, is placed on the substrate which is then positioned in feed tube 22. The substrate and first catalyst particles are positioned so that they are positioned in about the center of feed tube 22 at the intersection of waveguide 24 and feed tube 22. The substrate can be positioned in feed tube 22 on a rod which is desirably an aluminum oxide rod. After the substrate and associated first catalyst particles have been positioned in feed tube 22, the pressure in feed tube 22 is reduced by means of vacuum pump 16. A total vacuum is not created in feed tube 22 but the pressure is reduced to a pressure measuring from about 10 Torr to about 100 Torr and, desirably, from about 20 Torr to about 50 Torr. The gases from the hydrogen gas tank 30 and carbon-based gas tank 32 are fed through the gas lines 38 and combined to form a mixture of gases which is fed from tanks 14 through gas lines 36 to feed tube 22. As stated above, mass flow controllers 40 control the flow of gases from tanks 14 to feed tube 22. Typically, the gas flow will be provided at a rate from about 20 sccm to about 1000 sccm and desirably at about 100 sccm.

As the mixture of gases flows into feed tube 22 and passes waveguide 24, it is subjected to a flow of energy emitted from power supply 20 of reactor 12 and is formed by the heat energy generated by the power supply 20 into a plasma containing carbon free-radicals, hydrogen free-radicals, hydrocarbon free-radicals, and oxygen free-radicals, if an oxygen containing gas is used. The energy is conveyed from power supply 20 to feed tube 22 through waveguide 24. To generate the plasma, power supply 20 requires from about 600 Watts to about 1200 Watts of power. Once the desired amount of fibers have been formed, the flow of energy from power supply 20 is discontinued, the gas flow is ceased and the fibers are removed from the reactor 12. When a growth catalyst gas is employed in the reaction, the growth catalyst gas is supplied from tank 34 simultaneously with the hydrogen gas and the carbon-based gas in the mixture of gases.

In another version of the process of this invention, the first catalyst can be provided to feed tube 22 in a gaseous state rather than being provided as solid particles. If the first catalyst is used in a gaseous state, it will be provided from tank 36 through gas lines 38 to feed tube 22. It may be supplied to feed tube 22 in combination with the hydrogen gas and the carbon-based gas simultaneously as a mixture of gases. The first catalyst is formed into a plasma in feed tube 22 by means of the energy generated by the power supply 20 along with the hydrogen gas and the carbon-based gas. In this embodiment of the process of this invention, no substrate or solid catalyst particles are needed. Instead, the carbon nanofibers are produced on a steady state basis and, for that reason, it is necessary to supply apparatus 10 at one end of feed tube 22 with a catch basin, such as catch basin 46, in which the fibers can be collected.

The carbon nanofibers formed by the above described processes of this invention have several applications. The high level of graphitization and crosslinking allows these fibers to efficiently conduct heat. By being able to efficiently conduct heat, these fibers can be used to provide thermal management systems such as heat sinks for use in computers and printed circuit boards. The high aspect ratio allows these fibers to be used to shield electro-magnetic interference and to absorb radio frequency and microwave energy.

Specifically, the fibers formed by the method of this invention can be used to form high thermal conductivity cold plates for standard electronic module (SEM) boards and other electronic cooling applications such as heat sinks for high current devices such as MOS-Controlled Thyristors (MCTs). The fibers may also be used as an additive to provide improved strength and reinforcement to plastics, rubber, concrete, epoxies, and other materials. The carbon fibers can also be used as a replacement for carbon in rubber applications. At higher concentrations, the fibers could be used to form an electrically conductive rubber. Because of their high electrical conductivity and small volume, the fibers can be used as an obscurant for microwaves, radio frequencies and other electromagnetic interferences. The fibers can also be used to form passive heat sinks for high heat flux devices. Electrically and thermally conductive adhesives and fillers can be formulated with the carbon nanofibers as the key component. Finally, they can be used to absorb oil slicks on bodies of water because of their high surface area.

The carbon nanofibers formed by the process of this invention can be further processed to form a matrix material, such as a carbon-carbon matrix material or a carbon-epoxy matrix material, having an increased strength modulus, electrical conductivity and thermal conductivity. To form a carbon-carbon matrix material, the carbon nanofibers can be formed by either of the above described methods. After formation, the fibers are not removed from reactor 12. Instead, the flow of gases into feed tube 22 is adjusted to form a second mixture of gases. This second mixture of gases is formulated to contain a higher concentration of the carbon-based gas. Typically, the second mixture of gases will contain from about 0% to about 60% of the hydrogen gas and from about 40% to about 100% of the carbon-based gas. A person of skill in the art will appreciate that a different gas, such as one of those listed above, may be used as the carbon-based gas in forming the carbon matrix. However, by using the same gas for the carbon-based gas, the reaction is not delayed by changes to the gas supply. Upon pyrolyzation, the increased concentration of carbon-based gas in the second mixture of gases forms a bulk carbon layer which infiltrates the carbon nanofibers to form a carbon-carbon matrix material. The matrix material is then removed from reactor 12 and can then be processed further for its desired use.

A matrix material may also be formed through the use of epoxy materials. After the fibers have been formed on the substrate by means of the process described above, the substrate is removed from the reactor without removing the fibers from the substrate. The substrate is then used to form a portion of a mold used to make the matrix material. The remainder of the mold is formed so that it incorporates the substrate. An epoxy material is then poured into the mold and so that it infiltrates the mass of fibers in the mold. The epoxy material is then cured so that the epoxy material and the carbon nanofibers form a matrix material. After the epoxy material has been cured, the matrix material is removed from the mold and the substrate. The resulting matrix material comprises a carbon-epoxy matrix material which has high conductivity carbon nanofibers throughout its thickness. The carbon-epoxy matrix material can also be compression molded to a desired shape before being removed from the mold.

The method of forming carbon nanofibers of the present invention will now be illustrated by reference to the following example. The method is not intended to be limited to the specific, exemplary materials below, but, rather, may be practiced generally by the principles delineated below.

Example

Approximately 0.1 grams of an iron sulfide catalyst was sprinkled onto a ceramic substrate. The ceramic substrate was then inserted into the feed tube of the deposition apparatus. The pressure in the feed tube was reduced with a mechanical vacuum pump. A mixture of 50% hydrogen gas and 50% methane gas was then fed into the feed tube. Once the pressure in the feed tube reached 20 Torr, the power to the microwave reactor, an ASTEX microwave reactor, was turned on for approximately three minutes. The mixture of gases was formed into a plasma at a substrate temperature of approximately 1000° C. The gas feed was then terminated along with the power to the reactor. The pressure in the feed tube was again reduced and the system was evacuated to prevent excess methane and hydrogen gas from escaping to the atmosphere. The substrate was then removed from the feed tube. Approximately 0.01 grams of carbon nanofibers were formed.

While certain representative embodiments and details have been shown for purposes of illustrating the invention, it will be apparent to those of skill in the art that various changes, modifications and alterations can be made to the process of this invention as disclosed herein without departing from the scope of the invention, which is defined in the appended claims.

What is claimed is:

1. A process for making carbon nanofibers in a reaction vessel comprising the steps of:
   providing, in a reactor, a first catalyst in the form of solid catalytic particles said first catalyst selected from the group consisting of iron or iron alloys, nickel or nickel alloys, cobalt or cobalt alloys, ferrocene, iron pentacarbonyl, sulfur, hydrogen sulfide, iron sulfide and nickel nitrate;
   applying a vacuum to the reactor to create a reduced pressure in the reactor;
   feeding a first mixture of gases including a carbon-based gas into the reactor;
   providing a microwave energy source to heat the reactor to a reaction temperature and form plasma,
   forming, from the carbon-based gas, a plasma containing carbon free-radical species; and forming, in the presence of the catalytic particles, which serve to nucleate fibers and cause the beginning of fiber growth, the plasma containing carbon free-radical species into carbon nanofibers, and
   optionally feeding a second growth catalyst gas into the reactor to cause the carbon nanofibers to increase diametrically in size.

2. The process of claim 1 wherein the mixture of gases also includes hydrogen gas which is provided to inhibit pyrolytic fattening of the carbon nanofibers.

3. The process of claim 1 further including the step of feeding a growth catalyst gas into the reactor to cause the nanofibers to increase diametrically in size.

4. The process of claim 1 wherein the reduced pressure measures from about 10 Torr to about 100 Torr.

5. The process of claim 3 wherein the reduced pressure measures from about 20 Torr to about 50 Torr.

6. The process of claim 1 further including the steps of providing a substrate in the reactor and placing the catalytic particles on the substrate.

7. The-process of claim 6 wherein the substrate is formed from an inert dielectric material.

8. The process of claim 2 wherein the carbon-based gas is selected from the group consisting of carbon dioxide, methane, ethane, propane, ethene, natural gas and coal derivative gases.

9. The process of claim 8 wherein the carbon-based gas is methane.

10. The process of claim 9 wherein the mixture of gases comprises from about 40% to about 90% hydrogen gas and from about 10% to about 40% methane gas.

11. The process of claim 1 further including the steps of:
    increasing the concentration of the carbon-based gas in the first mixture of gases to form a second mixture of gases;
    pyrolyzing the second mixture of gases to deposit a bulk layer of carbon on the carbon nanofibers forming a carbon-carbon matrix material which contains carbon nanofibers throughout its thickness; and
    removing the matrix material from the reactor.

12. The process of claim 11 wherein the first mixture of gases comprises from about 40% to about 90% hydrogen gas and from about 10% to about 60% methane gas.

13. The process of claim 12 wherein the second mixture of gases comprises from about 0% to about 60% of hydrogen gas and from about 40% to about 100% of methane gas.

14. A process for making carbon nanofibers in a reactor comprising the steps of:
    applying a vacuum to the reactor to create a reduced pressure in the reactor;
    feeding a first mixture of gases including a carbon-based gas into the reactor;
    providing a microwave energy source to heat the reactor to a reaction temperature and form plasma;
    feeding a catalyst gas into the reactor, said catalyst gas selected from the group consisting of iron pentacarbonyl, hydrogen sulfide, and a ferrocene-xylene mixture;
    forming, from the carbon-based gas, a plasma containing carbon free-radical species; and forming, in the presence of the catalyst gas, which serves to nucleate fibers and cause the beginning of fiber growth, the plasma containing carbon free-radical species into carbon nanofibers, and optionally feeding a second growth catalyst gas into the reactor to cause the carbon nanofibers to increase diametrically in size.

15. The process of claim 14 wherein the mixture of gases also includes hydrogen gas which is provided to inhibit pyrolytic fattening of the carbon nanofibers.

16. The process of claim 14 further including the step of feeding a growth catalyst gas into the reactor to cause the fibers to increase diametrically in size.

17. The process of claim 14 wherein the reduced pressure measures from about 10 Torr to about 100 Torr.

18. The process of claim 17 wherein the reduced pressure measures from about 20 Torr to about 50 Torr.

19. The process of claim 15 wherein the carbon-based gas is selected from the group consisting of carbon dioxide, methane, ethane, propane, ethene, natural gas and coal derivative gases.

20. The process of claim 19 wherein the mixture of gases comprises from about 40% to about 90% hydrogen gas and from about 10% to about 60% methane gas.

21. The process of claim 14 further including the steps of:
increasing the concentration of the carbon-based gas in the first mixture of gases to form a second mixture of gases;
pyrolyzing the second mixture of gases to deposit a bulk layer of carbon on the carbon nanofibers forming a carbon-carbon matrix material which contains carbon nanofibers throughout its thickness; and
removing the matrix material from the reactor.

22. The process of claim 21 wherein the first mixture of gases comprises from about 40% to about 90% hydrogen gas and from about 10% to about 60% methane gas.

23. The process of claim 22 wherein the second mixture of gases comprises from about 0% to about 60% of hydrogen gas and from about 40% to about 100% of methane.

24. A process for forming an carbon-epoxy matrix material comprising the steps of:
providing, in a reactor, solid catalyst particles on a substrate;
feeding a mixture of gases including a hydrogen gas and a carbon-based gas into the reactor;
forming, from the carbon-based gas, a plasma containing carbon free-radical species;
forming, in the presence of the catalytic particles, carbon nanofibers;
removing the substrate bearing the carbon nanofibers from the reactor;
forming a mold in which a portion of the mold is formed by the substrate;
infiltrating the mold with an epoxy composition to form a carbon-epoxy matrix material containing carbon nanofibers throughout its thickness; and
removing the matrix material from the mold.

* * * * *

UNITED STATES PATENT AND TRADEMARK OFFICE
CERTIFICATE OF CORRECTION

PATENT NO : 6,156,256
DATED : December 5, 2000
INVENTOR(S) : Elliot Byron Kennel It is certified that error appears in the above-identified patent and that said Letters Patent are hereby corrected as shown below:

Col. 8, line 27, delete "The-process of" and insert --The process of--

Signed and Sealed this

First Day of May, 2001

Attest:

NICHOLAS P. GODICI

Attesting Officer     Acting Director of the United States Patent and Trademark Office